United States Patent
Steffan et al.

(10) Patent No.: US 6,200,823 B1
(45) Date of Patent: Mar. 13, 2001

(54) METHOD FOR ISOLATION OF OPTICAL DEFECT IMAGES

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/247,241

(22) Filed: Feb. 9, 1999

(51) Int. Cl.[7] ............................. G01R 31/26; H01L 21/66
(52) U.S. Cl. ........................ 438/14; 438/14; 438/16; 382/145; 382/149; 364/552
(58) Field of Search ..................... 438/16, 14; 382/145, 382/149; 364/552

(56) References Cited

U.S. PATENT DOCUMENTS

| | | | |
|---|---|---|---|
| 5,801,965 | * | 9/1998 | Tagaki et al. ................ 364/552 |
| 6,025,206 | * | 2/2000 | Chen et al. .................... 438/16 |
| 6,049,624 | * | 4/2000 | Wilson et al. ................ 382/145 |

* cited by examiner

Primary Examiner—John F. Niebling
Assistant Examiner—Olivia Luk
(74) Attorney, Agent, or Firm—H. Donald Nelson

(57) ABSTRACT

A method of manufacturing semiconductor devices wherein defect images are isolated from reference images in an optical tool. Each layer of a semiconductor are inspected for defects and identified defect images are subtracted from reference images providing an operator of the optical tool a resultant image of the defects or a highlighted image of the defect.

4 Claims, 2 Drawing Sheets

METHOD FOR ISOLATION OF OPTICAL DEFECT IMAGES

BACKGROUND OF THE INVENTION

1. Field of the Invention

This invention relates generally to the manufacturing of high performance semiconductor devices. More specifically, this invention relates to a method of isolating optical defect images that have been captured during inspection for defects.

2. Discussion of the Related Art

In order to remain competitive, a semiconductor manufacturer must continually increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also known as die) from each wafer is not 100% because of defects occurring during the manufacturing process. The number of good chips obtained from a wafer determines the yield. As can be appreciated, chips that must be discarded because of a defect increases the cost of the remaining usable chips.

Each semiconductor chip requires numerous process steps such as oxidation, etching, metallization and wet chemical cleaning. In order to etch metal lines, for example, a layer of photoresist is formed on the surface of the semiconductor chips and patterned by developing the photoresist and washing away the unwanted portion of the photoresist. Because the metal lines and other metal structures have "critical" dimensions, that is, dimensions that can affect the performance of the semiconductor chip, the process of forming the photoresist pattern for each layer is examined during the manufacturing process. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits.

In the course of modern semiconductor manufacturing, semiconductor wafers are routinely inspected using "scanning" tools to find defects. The scanning tool determines the location and other information concerning defects that are caught and this information is stored in a data file for later recapture and inspection of any of the defects. These data files are stored in a relational database that has the ability to generate wafer maps with defects shown in their relative positions. The data database typically has the ability to send these wafer map files to various review tools within the manufacturing plant. This is very useful as it allows for re-inspection on various after-scan inspection tools within the manufacturing plant. These inspection tools include Optical Microscopes and Scanning Electron Microscopes (SEMs) that allow for classification of the defects. Images taken on the various after-scan inspection tools can be linked by linkage data to the defect on a wafer map and reviewed at a workstation at an engineer's or technician's convenience.

In order to be able to quickly resolve process or equipment issues in the manufacture of semiconductor products, a great deal of time, effort and money is expended on the capture and classification of silicon based defects. Once caught and properly described, work can begin in earnest to resolve the cause, to attempt elimination, and to determine adverse effects on device parametrics and performance. The over-riding difficulty to date is the training and maintaining a cadre of calibrated human inspectors who classify all defects consistently and without error. One of the frustrations of human classifiers can be attributed to the inability to isolate or extract the defect in question from its original background environment.

Optical scan tools use a comparative method to find defects. The comparative method uses a reference die or cell to "look" for a difference between the reference and the current image. The difference is the so-called defect. The scan tool is often able to detect differences between the reference and current image, which it calls defects, which are not discernable by the human defect classifier. These type of differences or anomalies are generally referred to as nuisance or non-visual defects and they present the difficulty of determining whether they are a false signal based on poor recipe set-up or real defects, that are too small to be "seen" optically. Both situations are unacceptable in that in the first case the scan tool and the human classifier are wasting precious time investigating erroneous data while in the second case a potentially fatal process excursion may continue unabated even though caught by the scan tool manifesting itself in lost yield.

FIG. 1 shows a typical prior art method of manufacturing and inspecting wafers during the manufacturing process. A wafer lot is started through a manufacturing process, as indicated at 100. The first layer of each wafer of the wafer lot is subjected to a first process, 102. After the first process is completed, a selected number of wafers are inspected for defects at 104 and are called inspection wafers. The defect data is stored at 106 and information concerning the defect is forwarded to a defect management system (DMS) 108. It is determined at 110 if a wafer map exists. If it is determined at 110 that a wafer map exists, the defect information is added to the existing wafer map. If it is determined at 110 that a wafer map does not exist, a wafer map is created at 114 and the defect information is added to the newly created wafer map. The coordinates of the defect data from the wafer map and other defect information are stored in the defect management system 108.

After the wafers have been inspected at 104, the inspection wafer is placed in an optical tool at 116. The optical tool at 116 can be a microscope or a scanning electron microscope (SEM). With information concerning defects obtained from the defect management system 108, the optical tool scans to a defect location so that the operator can inspect and classify the defect. The operator "flips" between adjacent die in order to locate the defect visually, as indicated at 118. The methodology is indicated at 120 and shows 5 die with a feature indicated at 122. When the operator "flips" between the feature 122, for example, between the die 124 and 126, the operator will see no difference. On the other hand, when the tool locates feature 134 on die 130 and when the operator flips between die 130 and either die 128 or 132, the operator may or may not be able to see the feature depending upon the size of the feature and the background on the respective die.

After the operator optically scans the wafer at 118, it is determined at 136 if the layer just inspected is the last layer. If it is determined at 136 that the layer just processed is not the last layer, the next layer on all the wafers is processed, as indicated at 138 and the layer is inspected at 104. If it is determined at 136 that the layer just processed is the last layer, the wafer lot is finished as indicated at 140.

Therefore, what is needed is a system that is able to present to the operator of the optical tool an optical representation of the difference the tool is detecting. One method of doing this would be simply to "subtract" the so-called reference image from the defect image, on a pixel by pixel basis, and present that difference on a monitor. This method allows the operator to quickly determine if the anomaly is a merely a color variation problem, a threshold setting, or a real defect. The ideal device would present to the human operator exactly what the tool has identified as a defect rather than the complete field of view and letting the operator try to figure it out themselves. The defect could be either presented as only the difference between the two images, which would isolate the defect from its background or as highlighted, for example, with a circle drawn around it, so the operator could see it in the context of its background. This would serve to speed the review process as well as improve accuracy of scan recipes and classifications.

SUMMARY OF THE INVENTION

According to the present invention, the foregoing and other objects and advantages are attained by a method of manufacturing high performance semiconductor integrated devices in which defect images are isolated from reference images in an optical tool.

In accordance with an aspect of the invention, a layer on a lot of semiconductor wafers is processed, at least one inspection wafer is selected from the lot of semiconductor wafers and defects on the at least one inspection wafers are identified and images of the defects on the at least one inspection wafer are captured and stored in a database.

In accordance with another aspect of the invention, the optical tool isolates defect images from reference images by subtracting reference images from defect images.

In accordance with still another aspect of the invention, the optical tool isolates defect images from reference images by highlighting the defect images.

The method of the present invention thus effectively provides a semiconductor manufacturing process for the manufacturing of high performance integrated circuits that provides a method of isolating defect images from reference images that allows presentation to a human operator exactly what has been identified by a scanning tool as a defect.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
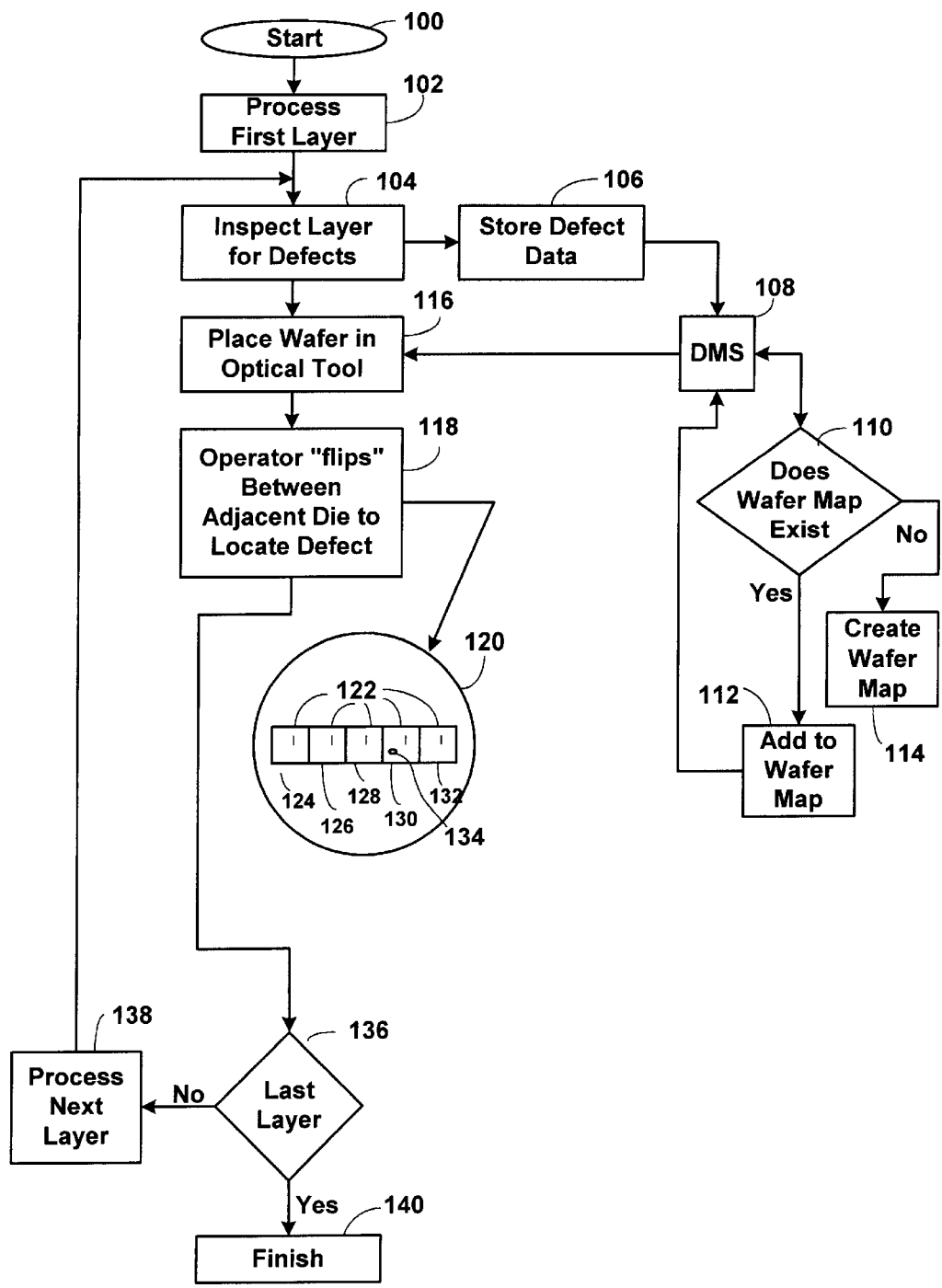
FIG. 1 illustrates a typical prior art method of manufacturing and inspecting wafers during the manufacturing process.
Figure 2:
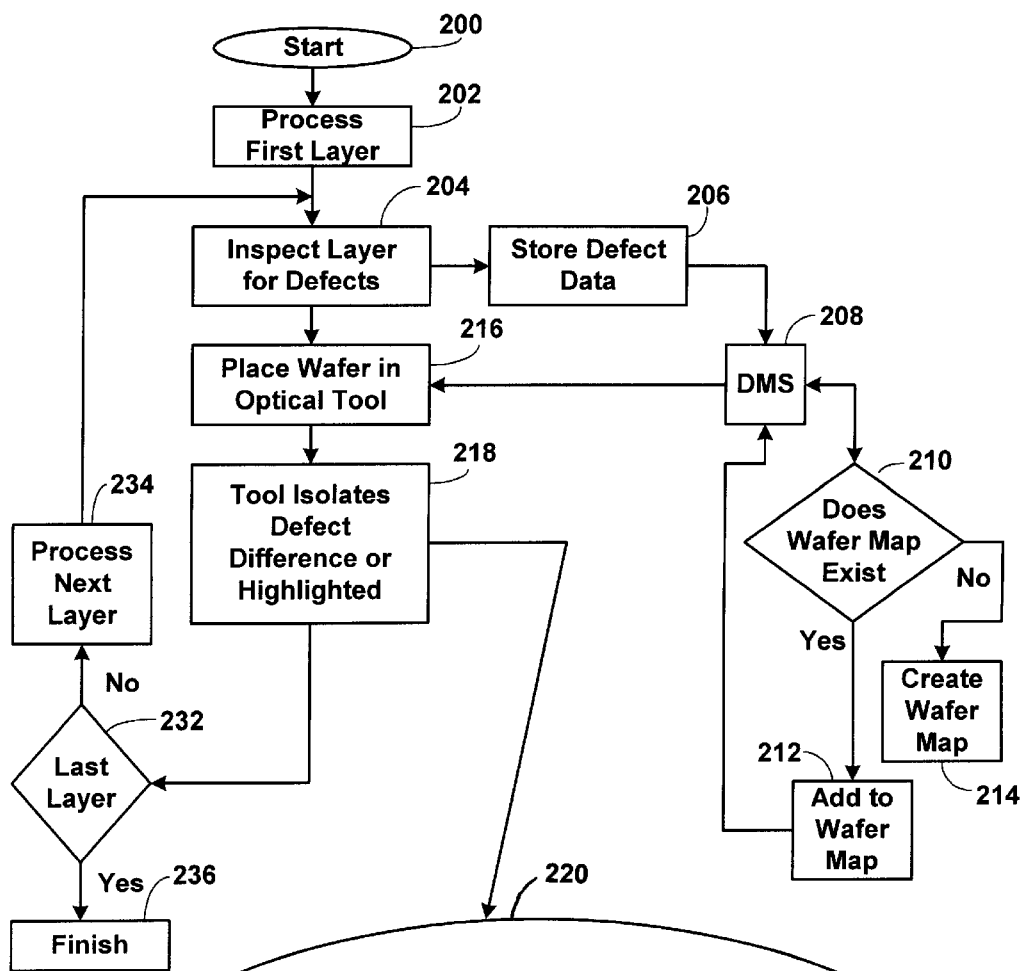
FIG. 2 illustrates a method of manufacturing and inspecting wafers during the manufacturing process in accordance with the present invention.
Figure 2:
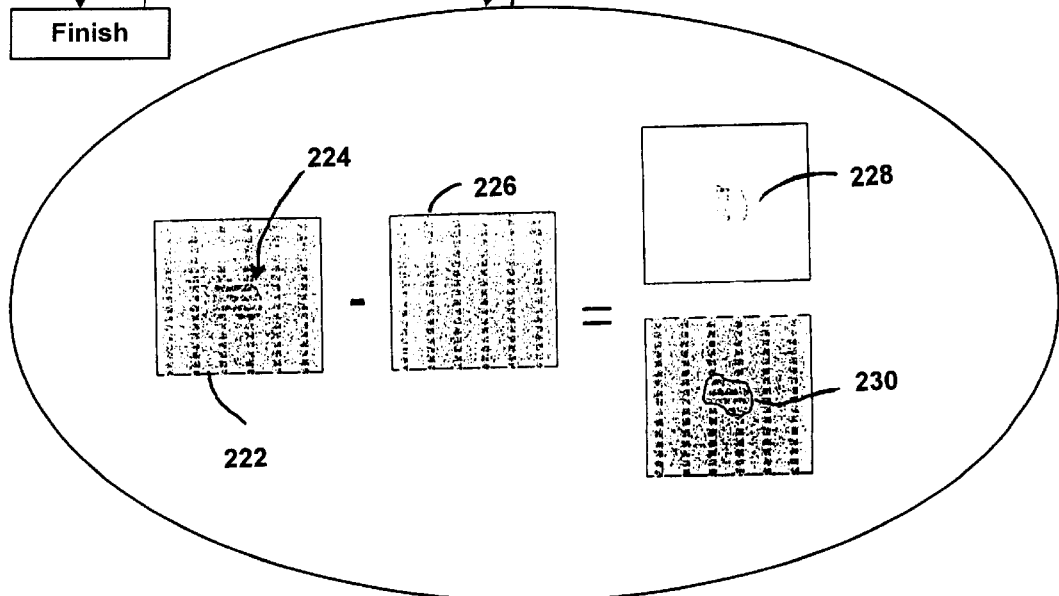

FIG. 2 shows a method of manufacturing and inspecting wafers during the manufacturing process in accordance with the present invention. A wafer lot is started through a manufacturing process, as indicated at 200. The first layer of each wafer of the wafer lot is subjected to a first process, 202. After the first process is completed, a selected number of wafers are inspected for defects at 204 and are called inspection wafers. The defect data is stored at 206 and information concerning the defect is forwarded to a defect management system (DMS) 208. It is determined at 210 if a wafer map exists. If it is determined at 210 that a wafer map exists, the defect information is added to the existing wafer map. If it is determined at 210 that a wafer map does not exist, a wafer map is created at 214 and the defect information is added to the newly created wafer map. The coordinates of the defect data from the wafer map and other defect information are stored in the defect management system 208.

After the wafers have been inspected at 204, the inspection wafer is placed in an optical tool at 216. The optical tool at 216 can be a microscope or a scanning electron microscope (SEM) that includes a method of subtracting a first image from a second image pixel by pixel or that includes a method of highlighting areas in an image that are different in two subsequent images. With information concerning defects obtained from the defect management system 208, the optical tool scans to a defect location so that the operator can inspect and classify the defect. The methodology is indicated at 220 and shows two portions of a semiconductor die or two portions of two semiconductor die. A first portion of a first semiconductor die is shown at 222 on which the inspection tool has identified a defect, indicated at 224. The tool subtracts a reference image of a portion of an adjacent die or an adjacent cell, indicated at 226 and presents the difference at 228. Alternatively, the tool presents the difference highlighted as shown at 230. As can be appreciated, with either presentation, the operator is presented with the image of a defect without having to search or try to visually discriminate between the defect and the background.

After the operator optically scans the wafer at 218, it is determined at 232 if the layer just inspected is the last layer. If it is determined at 232 that the layer just processed is not the last layer, the next layer on all the wafers is processed, as indicated at 234 and the layer is inspected at 204. If it is determined at 232 that the layer just processed is the last layer, the wafer lot is finished as indicated at 236.

In summary, the results and advantages of the method of the present invention can now be more fully realized. The method of the present invention thus effectively provides a semiconductor manufacturing process for the manufacture of high performance integrated circuits that provides a method of isolating defect images from reference images. The isolation of defect images allows presentation to a human operator exactly what have been identified by a scanning tool as defects.

The benefits of the method of the present invention are as follows:

1. It serves as an aid in setting up processing recipes.
2. It simplifies the defect classification process.
3. It isolates the true difference between the a defect image and a reference image.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing semiconductor devices, the method comprising:

(a) processing a layer on wafers in a lot of semiconductor wafers;

(b) selecting at least one inspection wafer from the lot of semiconductor wafers;

(c) inspecting the layer on the at least one inspection wafer for defects;

(d) storing defect data in a defect management system data base;

(e) placing the at least one inspection wafer in an optical tool;

(f) forming an optical image of a portion of the at least one inspection wafer;

(g) storing the optical image of the portion of the at least one inspection wafer as a reference image;

(h) forming an optical image of a next portion of the at least one inspection wafer;

(i) comparing the optical image of the next portion of the least one inspection wafer pixel by pixel with the optical image stored as a reference image;

(j) if there is no difference between the optical image of the next portion of the at least one inspection wafer and the reference image, replace the reference image with the optical image of the next portion of the at least one inspection wafer, wherein the optical image of the next portion of the at least one inspection wafer becomes the reference image;

(k) repeating steps (h) and (i) until there is a difference between the optical image of the next portion of the at least one inspection wafer and the reference image, wherein the difference identifies a defect, wherein information concerning the defect is stored in the defect management system;

(l) repeating steps (h) and (j).

2. The method of claim 1 wherein the portion of the at least one inspection wafer is a die.

3. The method of claim 2 further comprising storing defect data and defect images in a database.

4. The method of claim 3 further comprising creating a wafer map and adding defect data to the wafer map.

* * * * *